Dec. 9, 1969 G. YANISHEVSKY 3,483,425
CONTROLLED-BIAS CURRENT AMPLIFIER
Filed Aug. 31, 1967
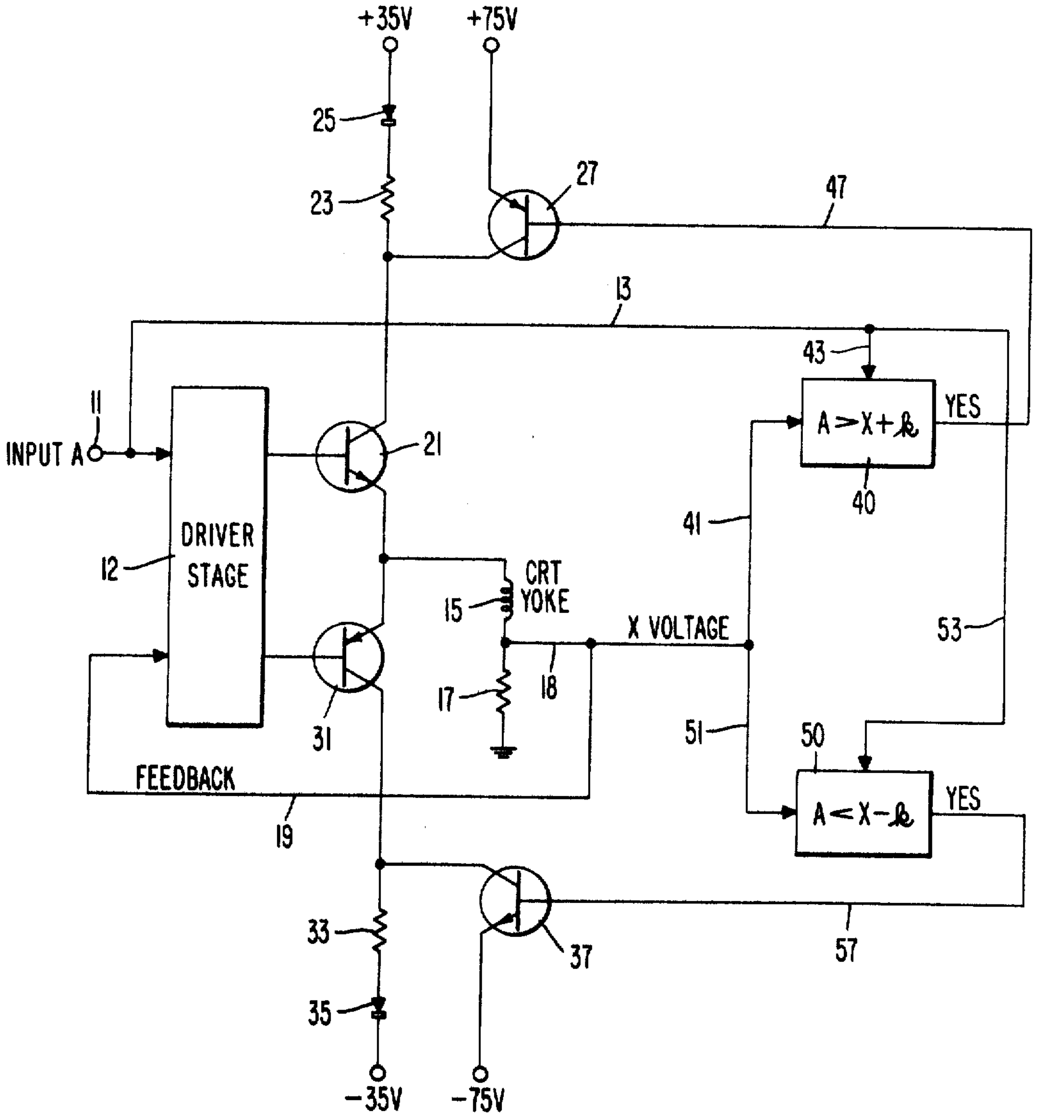
INVENTOR.
GILBERT YANISHEVSKY
BY George L. Kensinger
ATTORNEY

United States Patent Office 3,483,425

Patented Dec. 9, 1969

3,483,425

CONTROLLED-BIAS CURRENT AMPLIFIER

Gilbert Yanishevsky, Philadelphia, Pa., assignor to Burroughs Corporation, Detroit, Mich., a corporation of Michigan Filed Aug. 31, 1967, Ser. No. 664,782

Int. Cl. H01j *29/70;* H03k *5/20;* H03b *3/02*

U.S. Cl. 315—18 13 Claims

ABSTRACT OF THE DISCLOSURE

Deflection signal amplifiers for current-controlled display apparatus having an input terminal, a driver stage, a biased output-current stage electrically connected to the driver stage and to a deflection control winding, controllable bias means electrically connected to the output stage, and signal comparing apparatus electrically connected to the input terminal, to the deflection control winding and to the control terminal of the controllable bias means.

BACKGROUND OF THE INVENTION

This invention relates to high speed current amplifiers. More particularly, the subject invention relates to bias control apparatus for increasing the rate of switching in current amplifiers useful for deflection control in electrically operated display apparatus.

Cathode ray tube (CRT) display devices are being adopted in increased numbers and in new applications in data processing systems and data communication systems. Applications such as alphanumeric and graphical display in data processing systems are establishing new and higher writing speed requirements for such devices. It has become necessary when tracing a line segment under the control of information signals to cause the beam to travel across a portion of a CRT screen in a shorter time interval.

In display devices which utilize electromagnetic coils for controlling the deflection of an electron beam, it may be necessary to increase the rate of change of current in the coil to increase the speed of beam deflection. Since such coils exhibit primarily inductive characteristics, it is necessary to increase the voltage applied across the coil for increasing the rate of current change therein in accordance with the equation $di/dt=V/L$. It is important, however, to keep steady state current and power dissipation at a minimum despite the use of increased voltage for high speed beam deflection.

SUMMARY OF THE INVENTION

The current amplifier of this invention is subjected to bias potentials during changes in current level or transient operation which are different than those applied during steady state conditions of current flow or nonconduction. High power, high voltage operation occurs only during rapid transient operation, followed by low voltage, low power operation during slowly changing conditions. Different values of quiescent amplifier voltage are applied by the biases independent of the input signal level.

It is an object of this invention to provide bias control in high-speed current amplifiers.

Another object of the present invention is to increase the rate of current switching in amplifiers without increasing the level of current conduction and power dissipation during steady state conditions.

It is a further object of the subject invention to apply increased bias potential to a current amplifier whenever the output signal magnitude is less than the input signal magnitude by a predetermined margin.

This invention relates to the application of increased bias potential to an output stage of a current amplifier.

It also contemplates the application of bias potential directly to the output terminal of such a current amplifier.

In accordance with these objects there is provided a bias-controlled current amplifier having a biased current conduction stage adapted to receive electrical signals on an input terminal and adapted to be connected to a current utilization device, controllable bias means electrically connected to the current conduction stage and having a control terminal, and voltage comparing means electrically connected to the current utilization device, to the input terminal and to the control terminal of the bias means for changing the bias potential on the current conduction stage whenever the output signal magnitude differs from the input signal magnitude. The voltage comparing means may be threshold-sensitive, is desired, for permitting a preselected margin between the input and output signal magnitudes to exist without activating the controllable bias means.

The output signal voltage monitors the current magnitude in the utilization device and may be observed across an impedance in circuit therewith. This signal may be utilized as a feedback signal for an input driver stage for further regulating the switching speed of the amplifier. Separate current valve means may be utilized in the current conduction stage for conducting current in different directions to the current utilization device.

These and other objects, advantages and features of the subject invention will be more apparent from the following detailed description when considered with references to the accompanying drawings wherein:

The figure is an electrical schematic circuit diagram of one embodiment of the present invention.

DESCRIPTION OF THE PREFERRED EMBODIMENTS

In the figure is shown a current amplifier embodying the present invention for driving a magnetic deflection coil of a CRT display device. Input signals are received on input terminal 11 of driver stage 12 and output current is driven through CRT yoke 15 and series connected resistor 17 to ground. The output current magnitude is monitored over conductor 18 which is connected between the yoke and resistor 17. The voltage sensed at this point is designated voltage X; it is applied to signal comparators 40 and 50 and to driver 12 by conductor 19 as neg. feedback.

The output signals from driver 12 are applied to opposite conductivity transistors 21 and 31. NPN transistor 21 responds to positive-going signals, while PNP transistor 31 responds to negative-going signals for conducting positive and negative currents through the yoke 15, respectively. These transistors 21 and 31 drive the CRT yoke 15 as emitter-follower amplifiers in this embodiment of the invention and their emitters are connected together at one end of the coil.

Transistor 21 is normally biased by a source of positive 35 volts through series connected diode 25 and resistor 23 connected to its collector. Also connected to the collector of transistor 21 is the collector f switch transister 27, the emitter of which is connected to a source of positive 75 volts.

Transistor 31 is normally biased by a source of —35 volts through series connected diode 35 and resistor 23 connected to its collector. Also connected to the collector of transistor 31 is the collector of transistor 37, the emitter of which is connected to a source of —75 volts.

The output monitoring voltage X on conductor 18 is applied to signal comparator 40 through conductor 41 and to signal comparator 50 through conductor 51. Each of these signal comparators may consist of voltage comparators connected to switch drivers for control signal amplification. The voltage comparators thereof produce an output control signal as long as the input signals differ in magnitude by more than a specified amount.

Signal comparator 40 receives voltage X over conductor 41 and the input signal voltage on conductor 43 through conductor 13, which is connected to input terminal 11. An output signal appears on conductor 47 whenever and as long as the input signal A is greater than the sum of output monitoring voltage X and a predetermined voltage increment designated *k*. This control signal is applied to the base electrode of transistor 27, which it switches into and holds in conduction while it persists.

Therefore, a bias of 75 volts less the relatively small voltage drop in the emitter-collector circuits of transistors 21 and 27 is applied through transistor 27 to deflection winding 15 when positive signals are received, until current builds up to the corresponding magnitude in the coil. Once the current in the coil rises to a magnitude corresponding to the preselected voltage A minus *k*, then switch transistor 27 is turned off and a steady bias of 35 volts is applied to transistor 21.

Since the steady state or quiescent bias in the circuit is 35 volts and only the transient bias is 75 volts, a relatively low power rating transistor can be utilized as transistor 21 in the amplifier. The steady state power dissipation occurs at the lower bias voltage of 35 volts and, therefore, requires less operating bias power in the circuit and reduces the amount of heat generated in the components of the amplifier. Furthermore, low power rating transistors are generally cheaper than larger capacity units and are capable of switching faster in response to input signals.

It is desirable to quickly change current in the magnetic deflection coil of CRT yokes in order to shorten the time required to display information on the CRT screen or to permit the display of a greater amount of information in a given period of time. This circuit is effective to switch the output signal voltage of a current amplifier to a lower value once the output current increases to within a preselected margin of the corresponding current level or magnitude. During steady-state, positive input signals on terminal 11, the power dissipation is limited by resistors 23 and 17, which protects output transistor 21. During transient signals on the input terminal, switch transistor 27 is rendered conductive and diode 25 is reverse biased, thus effectively eliminating transistor 23 from the current path in the circuit.

Upon receipt of negative-going signals on input terminal 11, transistor 31 conducts. The output monitoring voltage X is applied to signal comparator 50 through conductors 18 and 51 and is compared to the input signal voltage on conductor 53 received over conductor 13. So long as negative input voltage A is less than the monitoring voltage X minus voltage increment *k*, switch transistor 37 is held conductive through conductor 37 and will apply −75 volts to the collector of transistor 31. This large negative voltage level is applied through transistors 37 and 31 to deflection coil 15 of the CRT display device and increases the rate of current change in the coil accordingly.

The change of current in the coil is proportional to the voltage applied across it and will therefore be increased rapidly until the current magnitude approaches the designated level by the higher bias voltage. Once that current level is reached, signal comparator 50 turns off switch transistor 37 through its switch driver and thus returns the bias on transistor 31 to a level of −35 volts. The switch transistors 27 and 37 could be connected alternatively to the 35 volt supplies, which would simply apply the normal bias power of the circuit directly to the output transistors 21 and 31 without limitation by resistors 23 and 33. Also, additional switch transistors and voltage supplies could be utilized for further regulating the speed of current switching in current amplifiers.

The controlled-bias technique of the subject invention is, of course, suitable for improving the speed of signal response of diverse current amplifiers.

Voltage comparator 150 is adjusted to be sensitive to voltage differences between the input terminals which exceed a preselected threshold margin. This preselected threshold increment or margin may represent, for example, 2%, 5% or more of the signal amplitude and is adjusted to prevent the occurrence of current overshoot in the operation of the circuit.

Bias switching transistor 141 is likewise connected to an end of deflection coil 106 and is controlled by signals at its base electrode supplied over conductor 145 from the comparator. This transistor is switched to full conduction if the output monitoring voltage on conductor 143 is less than the input signal magnitude by a similar preset margin of voltage.

Although the preferred embodiments of the invention have been described in detail, it should be understood that the present disclosure has been made by way of example only. Many modifications of the invention are possible in the light of the above teachings. It is therefore to be understood that within the scope of the appended claims the invention may be practiced otherwise than as specifically described.

I claim:

1. Amplifier apparatus comprising:

current amplifying means having a terminal for receiving input signals and an output circuit adapted to conduct current to a current utilization device, bias means electrically connected to the output circuit of said amplifying means for applying different levels of quiescent voltage thereto responsive to a control signal, and signal comparing means adapted to compare the input signal and the current magnitude in the current utilization device and being electrically connected for providing a signal to the bias means for controlling the level of bias applied to the current amplifying means as a function of the difference between the input signal magnitude and the output current magnitude.

2. The amplifier apparatus of claim 1 wherein the signal comparing means comprises a voltage comparator coupled to the input terminal and to the output circuit of the amplifying means and the bias means is coupled between the output circuits of the comparator and the amplifying means.

3. The amplifier apparatus of claim 2 wherein the current amplifying means comprises an emitter-follow amplifier adapted to be connected to the current utilization device and an impedance element is connected in circuit with the current utilization device for indicating the current magnitude therein.

4. The invention of claim 3 wherein a feedback conductor coupled to the amplifier input terminal is electrically connected to a point between the impedance element and the emitter-follower amplifier.

5. The amplifier apparatus of claim 1 wherein the bias means comprises a constant bias circuit and a controllable bias circuit both connected to the current amplifying means.

6. The amplifier apparatus of claim 5 wherein the constant bias circuit comprises impedance means and the controllable bias circuit comprises an electric valve having a control terminal, each circuit adapted to be connected to a source of bias potential.

7. The invention of claim 6 wherein the controllable bias circuit comprises a transistor having its input circuit connected for monitoring the amplifier output current and having its output circuit adapted to be connected to a source of potential different from that of the constant bias circuit.

8. The invention of claim 1 wherein the current amplifying means comprises a first emitter-follower transistor amplifier having a collector electrode electrically coupled to the bias means.

9. The invention of claim 8 wherein the current amplifying means further comprises a second emitter-follower transistor amplifier of opposite conductivity electrically connected in common with the first emitter-follower amplifier and being electrically coupled to the bias means.

10. High speed current-switching apparatus comprising:
- a current amplifier having an input terminal and having an output circuit adapted to be connected to a current-controlled inductive device,
- controllable bias means electrically connected to the output circuit of the amplifier for providing one of a plurality of output drive potentials thereto, and
- voltage comparing means electrically connected for controlling the output drive potential as a function of the relative difference between the magnitude of the input signal and that of the current in the inductive device.

11. The current-switching apparatus of claim 10 wherein the voltage comparing means is responsive to differences between the magnitude of the input signal and the magnitude of the current in the inductive device only above a predetermined level.

12. The invention of claim 11 wherein the controllable bias means comprises a current valve electrically connected to the voltage comparing means and to the output circuit of the current amplifier.

13. The invention of claim 11 wherein the current amplifier comprises a pair of parallel emitter-follower transistor amplifiers adapted to be connected in common to the current-controlled inductive device.

References Cited

UNITED STATES PATENTS

| | | | |
|---|---|---|---|
| 3,278,737 | 10/1966 | Germain | 307—235 |
| 3,288,929 | 11/1966 | Hutchinson | 307—235 |
| 2,587,313 | 2/1952 | Grundmann | 315—27 |

RODNEY D. BENNETT, Jr., Primary Examiner

JOSEPH G. BAXTER, Assistant Examiner

U.S. Cl. X.R.

307—235; 315—27; 328—146; 330—78